United States Patent
Khayat et al.

(10) Patent No.: US 10,110,256 B2
(45) Date of Patent: Oct. 23, 2018

(54) APPARATUSES AND METHODS FOR STAIRCASE CODE ENCODING AND DECODING FOR STORAGE DEVICES

(71) Applicant: MICRON TECHNOLOGY, INC., Boise, ID (US)

(72) Inventors: Patrick R. Khayat, San Diego, CA (US); Sivagnanam Parthasarathy, Carlsbad, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/267,967

(22) Filed: Sep. 16, 2016

(65) Prior Publication Data
US 2018/0083653 A1 Mar. 22, 2018

(51) Int. Cl.
*H03M 13/29* (2006.01)
*G06F 11/10* (2006.01)
*G11C 29/52* (2006.01)
*H03M 13/15* (2006.01)

(52) U.S. Cl.
CPC ..... *H03M 13/2906* (2013.01); *G06F 11/1068* (2013.01); *G11C 29/52* (2013.01); *H03M 13/1575* (2013.01)

(58) Field of Classification Search
CPC .......... H03M 13/2906; H03M 13/1575; G06F 11/1068; G11C 29/52
See application file for complete search history.

(56) References Cited

U.S. PATENT DOCUMENTS

| | | | | |
|---|---|---|---|---|
| 6,553,533 B2* | 4/2003 | Demura | ............... | G06F 11/1008 714/755 |
| 7,594,156 B2* | 9/2009 | Mejean | ............. | H03M 13/2909 714/755 |
| 7,774,688 B1* | 8/2010 | Teng | ................. | H03M 13/2909 714/782 |

(Continued)

FOREIGN PATENT DOCUMENTS

CN 105429646 A 3/2016

OTHER PUBLICATIONS

International Search Report and Written Opinion dated Nov. 20, 2017 for PCT Application No. PCT/US2017/047530.

(Continued)

*Primary Examiner* — Kyle Vallecillo
(74) *Attorney, Agent, or Firm* — Dorsey & Whitney LLP (57) ABSTRACT

An apparatus is provided. The apparatus comprises a first syndrome computation circuit configured to receive a codeword having a plurality of rows and a plurality of columns and further configured to compute a first syndrome for at least a portion of a first component codeword of the codeword. The apparatus further comprises a second syndrome computation circuit configured to receive the codeword and to compute a second syndrome for at least a portion of a second component codeword of the codeword. The apparatus further comprises a bit correction circuit configured to correct one or more erroneous bits in the codeword based, at least in part, on at least one of the first and second syndrome, wherein the first and second component codewords span two or more rows and two or more columns of the codeword.

24 Claims, 8 Drawing Sheets

(56) References Cited

U.S. PATENT DOCUMENTS

| | | |
|---|---|---|
| 8,656,244 B1 | 2/2014 | Chang |
| 2006/0279437 A1 | 12/2006 | Luby et al. |
| 2010/0325512 A1* | 12/2010 | Yokokawa ......... H03M 13/1137 714/752 |
| 2012/0266051 A1* | 10/2012 | Farhoodfar ........... H03M 13/15 714/782 |
| 2014/0215292 A1 | 7/2014 | Luby |
| 2014/0237325 A1 | 8/2014 | Farhoodfar et al. |
| 2015/0311920 A1* | 10/2015 | Wang ................ H03M 13/1545 714/764 |
| 2017/0078672 A1* | 3/2017 | Han ..................... H04N 19/159 |
| 2017/0155407 A1* | 6/2017 | Lin .................... H03M 13/152 |
| 2017/0264320 A1* | 9/2017 | Lin .................. H03M 13/2963 |

OTHER PUBLICATIONS

Kschischang, 'Staircase Codes', Talk at Delft University of Technology, Delft, The Netherlands, Apr. 23, 2013.
First Office Action for TW Application No. 106129186, dated Mar. 31, 2018.
Ernst, et al., "Transport Layer Coding for the Land Mobile Satellite Channel", Vehicular Technology Conference, 2004. VTC 2004-Spring. 2004 IEEE $59^{th}$.

\* cited by examiner

APPARATUSES AND METHODS FOR STAIRCASE CODE ENCODING AND DECODING FOR STORAGE DEVICES

BACKGROUND

Staircase codes are a type of product code that can be implemented in a forward error correction scheme. A staircase code includes a number of blocks arranged in a staircase pattern. Each block may include data bits and parity bits. In traditional staircase codes, each individual line and each individual column is a single component codeword comprising the data bits and parity bits. Component codewords span adjacent blocks to form valid codewords according to an error correcting code (ECC) scheme, such as a Bose-Chaudhuri-Hocquenghem (BCH) code. Because the blocks are arranged in a staircase pattern, component codewords may be formed in both the horizontal and vertical direction. That is, for any given data bit in a block, the bit is part of a horizontal codeword and a vertical codeword. Accordingly, each data bit is doubly encoded and may be corrected independently using two separate component codewords.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention. As used herein, in the context of staircase codes, the terms "sector" "block" and "codeword" are used interchangeably.

Embodiments of the present invention recognize that traditional staircase codes generally require large code words arranged in multiple large blocks (e.g., 16 KB blocks) to achieve satisfactory error correction capabilities. Such large code words may be tolerable in some contexts, such as optical communications, but in applications that typically manipulate data in smaller sectors, such as storage applications, decoding such large codewords arranged in multiple large blocks is wasteful of processing and power resources. For example, many memory systems, such as NAND flash memory, typically make data requests in 4 KB sectors. It would be inefficient to implement traditional large code word decoding (for a 16 KB sector) in order to access 4 KB worth of data. Accordingly, embodiments of the present invention disclose systems and methods for implementing a staircase code ECC scheme that takes advantage of the benefits of staircase codes while having efficient decoding means that can be implemented for smaller data requests, such as storage systems.

Figure 1:
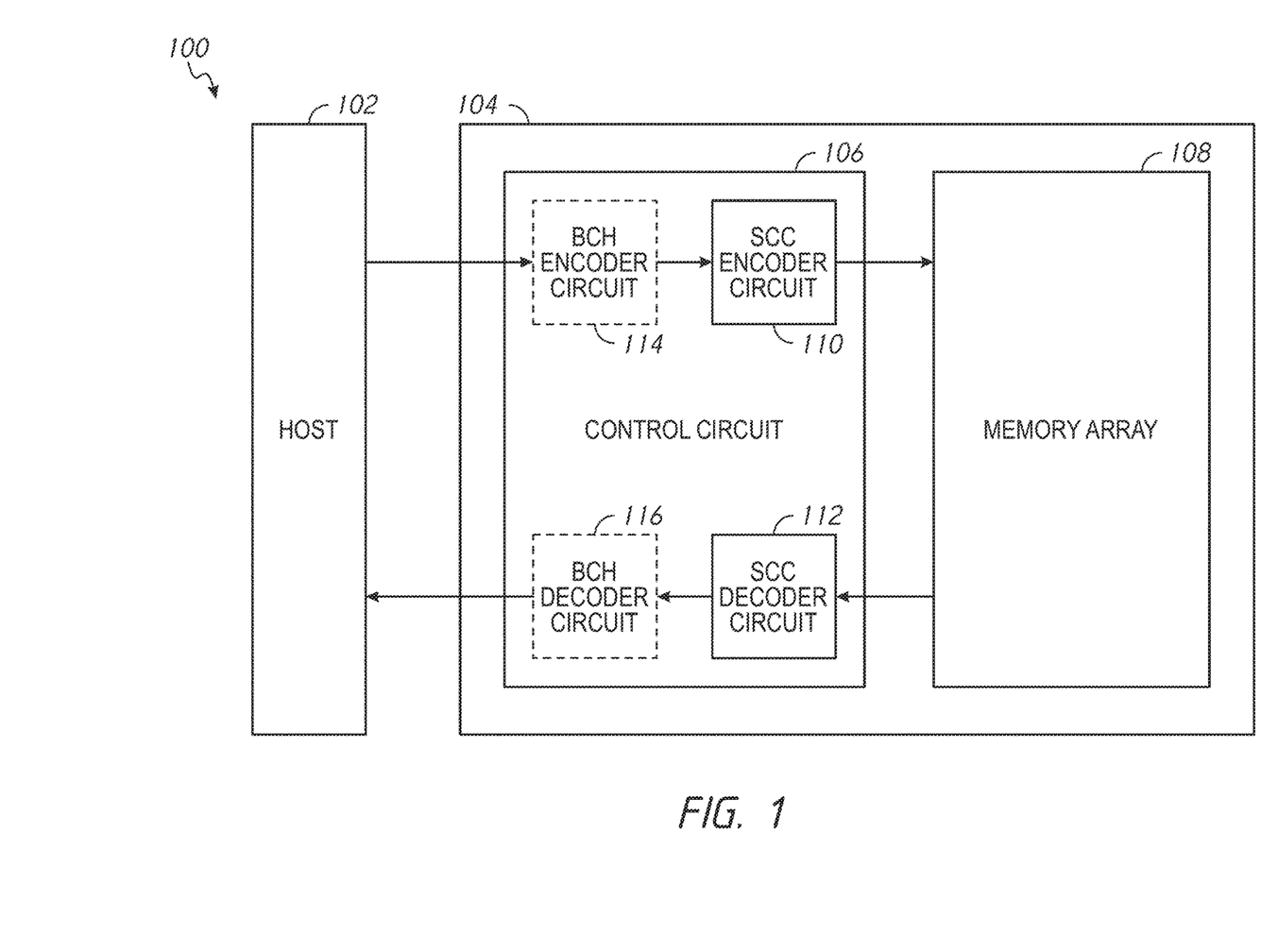
FIG. 1 is a block diagram of a memory system, in accordance with an embodiment of the present invention.

FIG. 1 is a block diagram of a memory system, generally designated 100, in accordance with an embodiment of the present invention. The memory system 100 includes a host 102 and a memory device 104. The memory device 104 includes a control circuit 106 and a memory array 108. The control circuit 106 includes a staircase code (SCC) encoder circuit 110 and an SCC decoder circuit 112. In various embodiments, the control circuit 106 may optionally include a BCH encoder circuit 114 and a BCH decoder circuit 116.

The host 102 may be a processor based system, such as a laptop computer, a desktop computer, a smart phone, or any other electronic device capable of communicating with the memory device 104. The host 102 may be configured to submit memory requests (e.g., read/write requests) to the memory device 104. The host 102 may be further configured to submit and receive data associated with the memory requests (e.g., read data and write data) to be retrieved from or stored in the memory device 104.

The memory device 104 includes a memory array 108. The memory array 108 may include one or more arrays of memory cells (e.g., non-volatile memory cells). The arrays may include NAND flash memory cells, NOR flash memory cells, phase change memory (PCM) cells, or a combination thereof. Embodiments are not limited to a particular type of memory device. For example, the memory device 104 may include RAM, ROM, HDD, DRAM, SDRAM, PCRAM, RRAM, flash memory, or any other type of memory.

The memory device 104 further includes a control circuit 106. The control circuit 106 is configured to perform memory operations on the memory array 108 in response to memory commands received from the host 102. The control circuit 106 may be further configured to encode and decode data stored in the memory array 108. Encoding data using an ECC may allow for correction of erroneous data bits when the data is retrieved from memory. For example, the control circuit 106 may encode data using the SCC encoder circuit 110 and the optional BCH encoder circuit 114 and store the encoded data bits and parity bits in the memory array 108. The control circuit 106 may be further configured to decode data stored in the memory array 108 using the SCC decoder circuit 112 and the optional BCH decoder circuit 116.

In various embodiments, the BCH encoder circuit 114 may be configured to encode write data received from the host 102 in accordance with an outer BCH code having relatively small correction capability (e.g., a 4 KB BCH code with correction capability of 25 bits). The BCH code is an "outer" code because it encodes data prior to encoding the data using the SCC encoder 110. Although described with respect to a BCH code, those skilled in the art will recognize that any suitable encoding method may be used as the outer code, and embodiments disclosed herein are not limited to BCH codes. For example, in one embodiment, the outer code may be a Reed-Solomon code. The outer BCH code may help to compensate for an increased error floor of the staircase code resulting from the use of relatively small staircase blocks (e.g., 96×96 bit blocks), as described in further detail below. The BCH encoder 114 may be further configured to provide the results of the BCH encoding to the SCC encoder circuit 110.

The SCC encoder circuit 110 may be a circuit configured to encode data in accordance with a small block staircase code. In embodiments including the BCH encoder circuit 114, the SCC encoder circuit 110 may receive encoded data from the BCH encoder circuit 114. In embodiments excluding the BCH encoder circuit 114, the SCC encoder circuit 110 may be configured to encode write data received from the host 102. In various embodiments, the BCH encoder circuit 114 and the SCC encoder circuit 110 may be configured to encode different portions of the write data in parallel such that the encoding takes place simultaneously. For example, once the BCH encoder circuit 114 has encoded a first codeword, the first codeword may be provided to the SCC encoder circuit 110 for encoding while the BCH encoder circuit 114 encodes a second codeword. The particulars of staircase encoding according to the present invention are described in further detail below with respect to FIGS. 2-5.

The SCC decoder circuit 112 may be configured to decode the small block staircase code generated by the SCC encoder circuit 110. For example, responsive to a read command from the host 102, the control circuit 106 may retrieve the requested, encoded data from the memory array 108, and the SCC decoder circuit 112 may decode the retrieved data. The optional BCH decoder circuit 116 may be configured to perform BCH decoding on received data and provide the decoded data to the host 102. In embodiments with the optional BCH decoder circuit 116, the SCC decoder circuit 112 may decode the staircase code to generate BCH encoded read data that is provided to the BCH decoder circuit 116. The BCH decoder circuit 116 may then decode the BCH encoded read data to generate the requested read data and provide the requested read data to the host 102. In embodiments that do not include the BCH decoder circuit 116, the SCC decoder circuit 112 may decode the staircase code and provide the requested read data to the host 102. Similar to the encoder circuits, the SCC decoder circuit 112 and the optional BCH decoder circuit 116 may perform decoding operations in parallel. For example, once the SCC decoder circuit 112 has decoded a first codeword, the BCH decoder circuit 116 may begin decoding the first codeword while the SCC decoder circuit 112 begins decoding a second codeword. The particulars of staircase decoding according to the present invention are described in further detail below with respect to FIG. 6.

Figure 2:
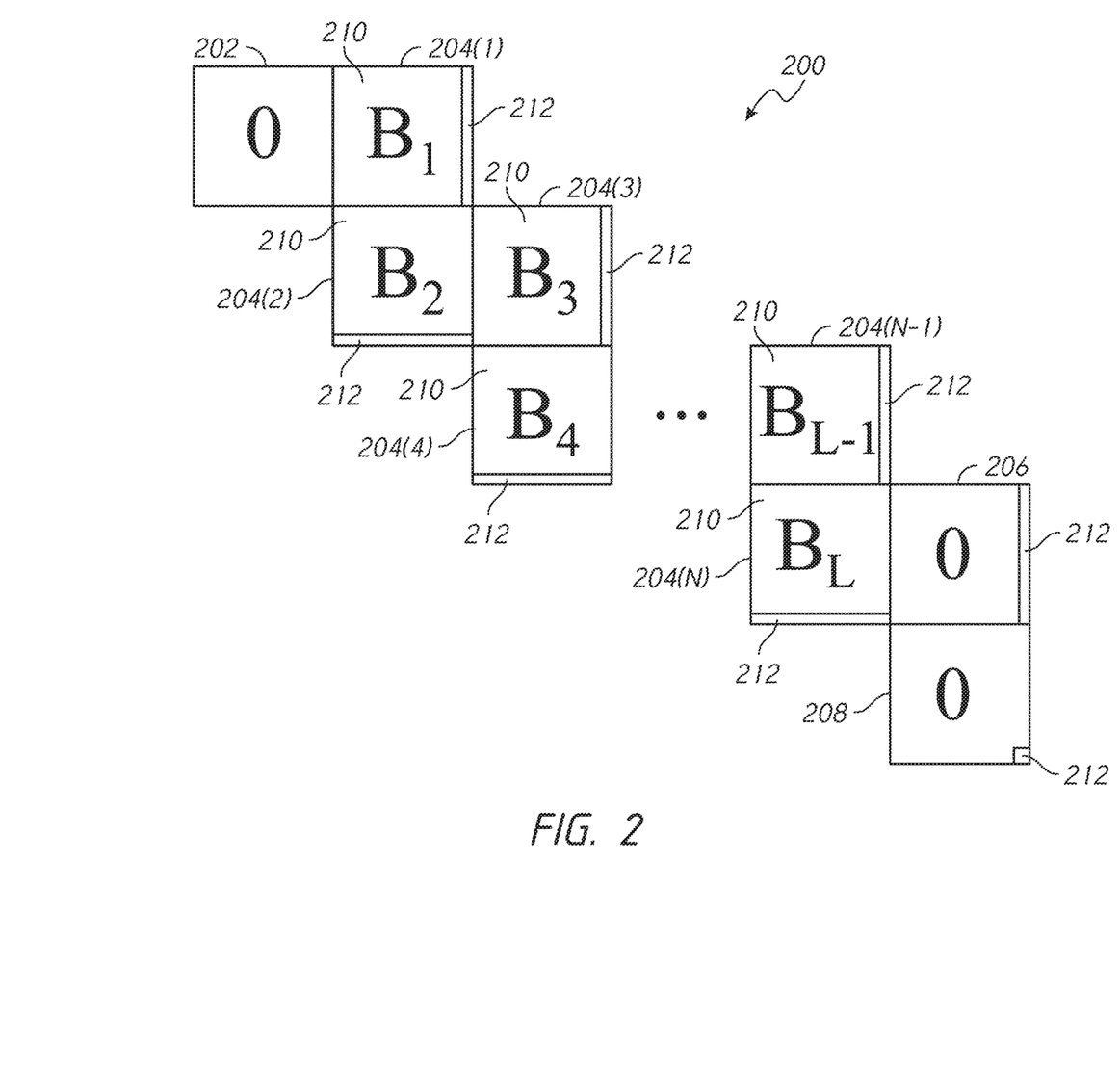
FIG. 2 is an example staircase code, in accordance with an embodiment of the present invention.

FIG. 2 is an example staircase code, generally designated 200, in accordance with an embodiment of the present invention. The staircase code 200 may be generated, for example, by the SCC encoder circuit 110 of FIG. 1 and stored in the memory array 108. The staircase code 200 generally includes an initial zero block 202, a number of SCC blocks 204(1)-(N), penultimate block 206, and a terminal block 208. The initial zero block 202 may include an array of bits where each bit is set to a predetermined value. For example, each of the bits in the initial zero block 202 may be set to a logical 0. Alternatively, other known values may be used. Similarly, the penultimate block 206 and the terminal block 208 may comprise entirely zero logical values except for non-zero parity bits generated from non-zero data bits or parity bits in preceding blocks, as discussed in further detail below. Each of the SCC blocks 204(1)-(N) may include a plurality of data bits 210 and parity bits 212.

The data bits 210 and parity bits 212, as well as the bits of the initial zero block 202, penultimate block 206, and the terminal block 208, may be arranged in horizontal and vertical component codewords of the staircase code 200. As described in further detail below with respect to FIGS. 3-6, the component codewords may be arranged such that each horizontal codeword spans multiple columns and each vertical codeword spans multiple rows. As shown in FIG. 2, the initial zero block 202, the SCC blocks 204(1)-(N), the penultimate block 206, and the terminal block 208 may be arranged in a staircase pattern having blocks alternatingly positioned adjacent to or below the preceding block. The particular arrangement of data bits 210 and parity bits 212 are discussed in further detail with respect to FIGS. 3-5.

Figure 3:
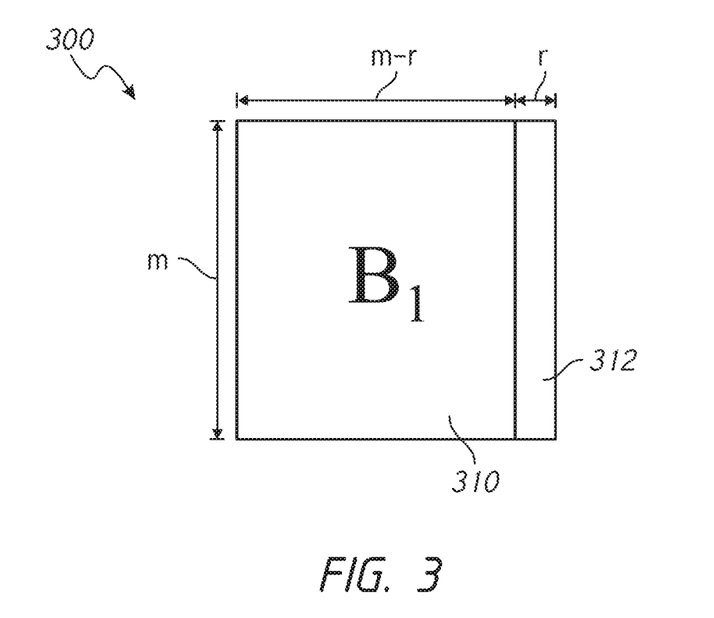
FIG. 3 is an example staircase code block, in accordance with an embodiment of the present invention.

FIG. 3 is an example staircase code block, generally designated 300, in accordance with an embodiment of the present invention. The staircase code block 300 includes a plurality of data bits 310 and a plurality of parity bits 312. The staircase code block 300 may be an m×m block that includes m×(m−r) data bits 310 and m×r parity bits 312. The data bits 310 and the parity bits 312 of the staircase code block 300 may be combined with data bits and parity bits of another staircase code block (not shown in FIG. 3) to form a plurality of valid code words, according to a particular coding scheme, such as a BCH code.

Figure 4:
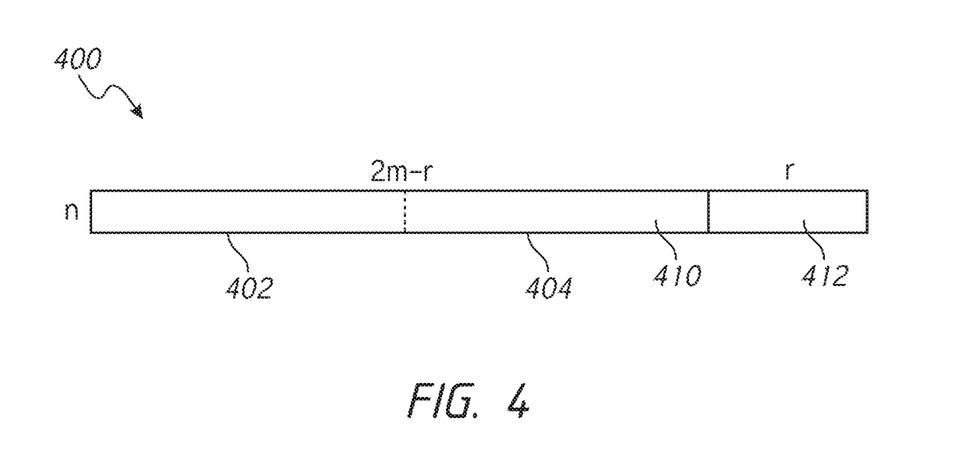
FIG. 4 is an example component codeword, in accordance with an embodiment of the present invention.

FIG. 4 is an example component codeword, generally designated 400, in accordance with an embodiment of the present invention. The component codeword 400 includes a plurality of data bits 410 and a plurality of parity bits 412. The component codeword 400 may be a horizontal component codeword and may span two staircase code blocks. In the embodiment of FIG. 4, the component codeword 400 spans staircase code blocks 402 and 404. The data bits 410 of the component codeword 400 may be wrapped across multiple rows and columns of the staircase code blocks 402 and 404. In the embodiment of FIG. 4, the component codeword 400 spans a total of 2m columns (m columns in each of blocks 402 and 404) and n rows. Similarly, vertical codewords may span 2m rows and n columns. While FIG. 4 shows parity bits at the end of each row for convenience, those skilled in the art will appreciate that the parity bits may be positioned at any point in the component codeword, such as at the end of all of the data bits 410 in the component codeword. By wrapping the data bits 410 and parity bits 412 across multiple rows and columns, the size of individual blocks in the staircase code may be reduced while maintaining the correction capability of longer component codewords. In various embodiments, the particular size of the blocks, as well as the number of blocks in the staircase code may be adjusted depended on performance requirements. For example, embodiments with strict timing requirements may be implemented with a smaller number of blocks than embodiments with more relaxed timing requirements. By reducing the number of blocks, the time required for decoding may be reduced.

In traditional staircase codes, component codewords do not span multiple rows. That is, traditional staircase codes have n=1. This format requires long codewords with large block sizes in order to achieve adequate data correction capabilities. Such large staircase code blocks, while suitable for some applications, have not been acceptable for other applications, such as memory applications, where data is routinely exchanged in much smaller sector sizes. For example, traditional staircase codes, as used in optical communications, transmit data in ~16 KB blocks with the total staircase code being as large as 100 KB or more. However, in various other applications, such as storage applications, the typical block size is ideally much smaller (e.g., 4 KB for storage applications). The large blocks that can be used in optical communications are simply not practical in applications utilizing smaller transactions, such as storage. However, by extending the component codeword 400 across multiple rows, staircase codes as disclosed herein may benefit from the error correction capabilities of long component codewords, without resulting in impractical block sizes.

Figure 5:
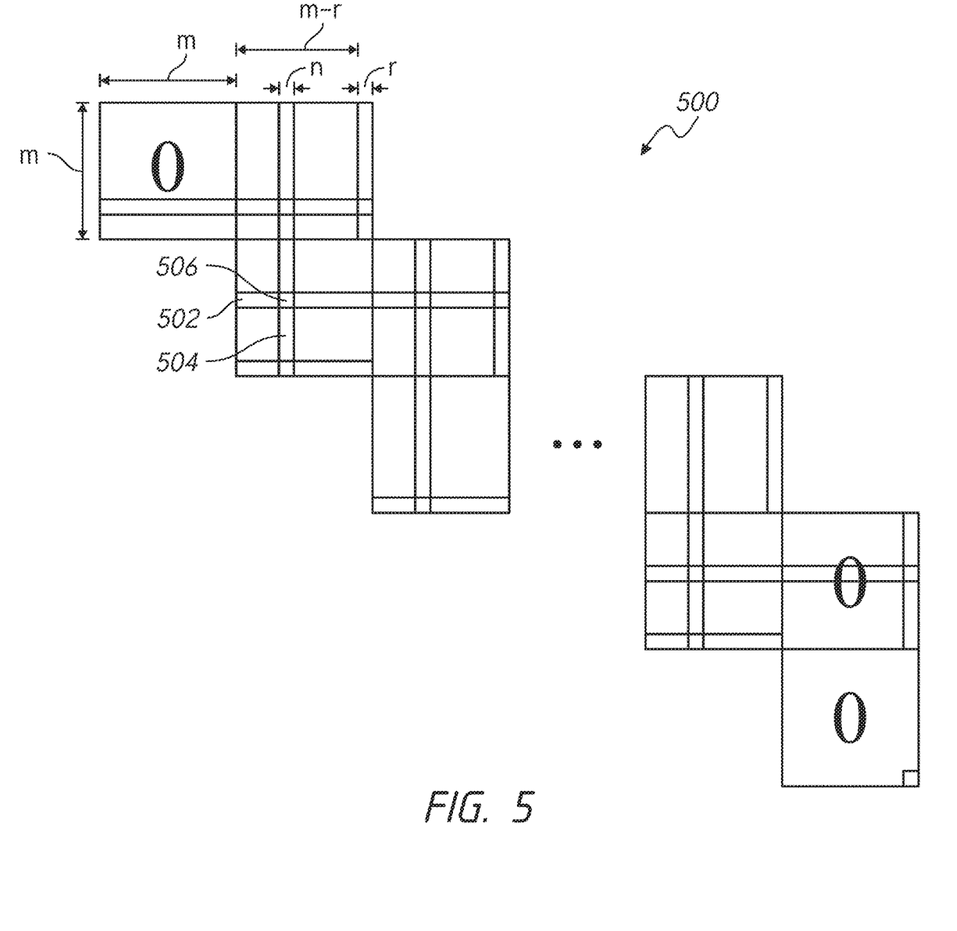
FIG. 5 is an example staircase code, in accordance with an embodiment of the present invention.

FIG. 5 is an example staircase code, generally designated 500, in accordance with an embodiment of the present invention. The staircase code 500 may be implemented as the staircase code 200 of FIG. 2. The staircase code 500 includes a plurality of horizontal component codewords 502 and vertical codewords 504. The horizontal component codewords 502 and the vertical component codewords 504 may intersect at vertices 506. The horizontal component codewords 502 may span multiple rows and the vertical component codewords 504 may span multiple columns. That is, the length of each component codeword may be greater than the length of the staircase step. As a result, each component codeword is wrapped according to a predetermined wrapping scheme. For example, in one embodiment, when a code word reaches the limit of bits to store in a row (e.g., 2m bits), then the next bit may be stored in the beginning of the next row. In another embodiment, the bits of the component codeword may be stored in a snake-like fashion, where bits are stored from left to right (or top to bottom) in one row (or column), and in a subsequent row (or column), the bits are stored in the opposite direction. While the particular wrapping scheme is not important for encoding purposes, when the staircase code is decoded, the wrapping scheme must be known to ensure that the correct bits are corrected responsive to detecting an erroneous bit.

Because each of the horizontal component codewords 502 and vertical component codewords 504 are n×2m bits long, each vertex 506 protect an n×n sub-block. In traditional staircase codes, having single row component codewords and single column component codewords, any pair of intersecting component codewords would protect a single bit at the intersection. In contrast, staircase codes in accordance with embodiments of the present invention may protect an n×n sub-block at the vertex 506, meaning that erroneous bits within the protected vertex may be corrected based on the parity bits of the component codeword. In one embodiment, the staircase code may be constructed as follows: m=48, r=5, L=16, and n=6 where each component codeword is a BCH codeword having 576 data bits, 32 parity bits, and a correction capability of t=3 bits.

In various embodiments, organizing component codewords across multiple columns or rows may increase the probability of errors occurring in the component codewords that are not correctable using standard decoding techniques. In traditional staircase codes, each bit is protected by two component codewords. An uncorrectable error, generally referred to as a stall pattern, can occur in which erroneous bits belong to component codewords, both horizontal and vertical, that have a higher number of errors than can be corrected for each component codeword. Stall patterns may be more prevalent in staircase codes with wrapped component codewords because there is an increased likelihood that an erroneous bit will occur in the n×n vertex 506 than in the single bit vertex of traditional staircase codes. An additional, outer code, such as a BCH code with small correction capability, may be used to encode the data prior to encoding the data using the staircase code, to compensate for the increased likelihood of a stall pattern. For example, with reference to FIG. 1, the optional BCH encoder circuit 114 may serve to perform this function. By including an outer BCH code with relatively low correction capabilities, any residual bit errors following staircase decoding may be corrected using the outer BCH code. In one example, the outer BCH code may have a correction capability of t=25 bits.

Figure 6:
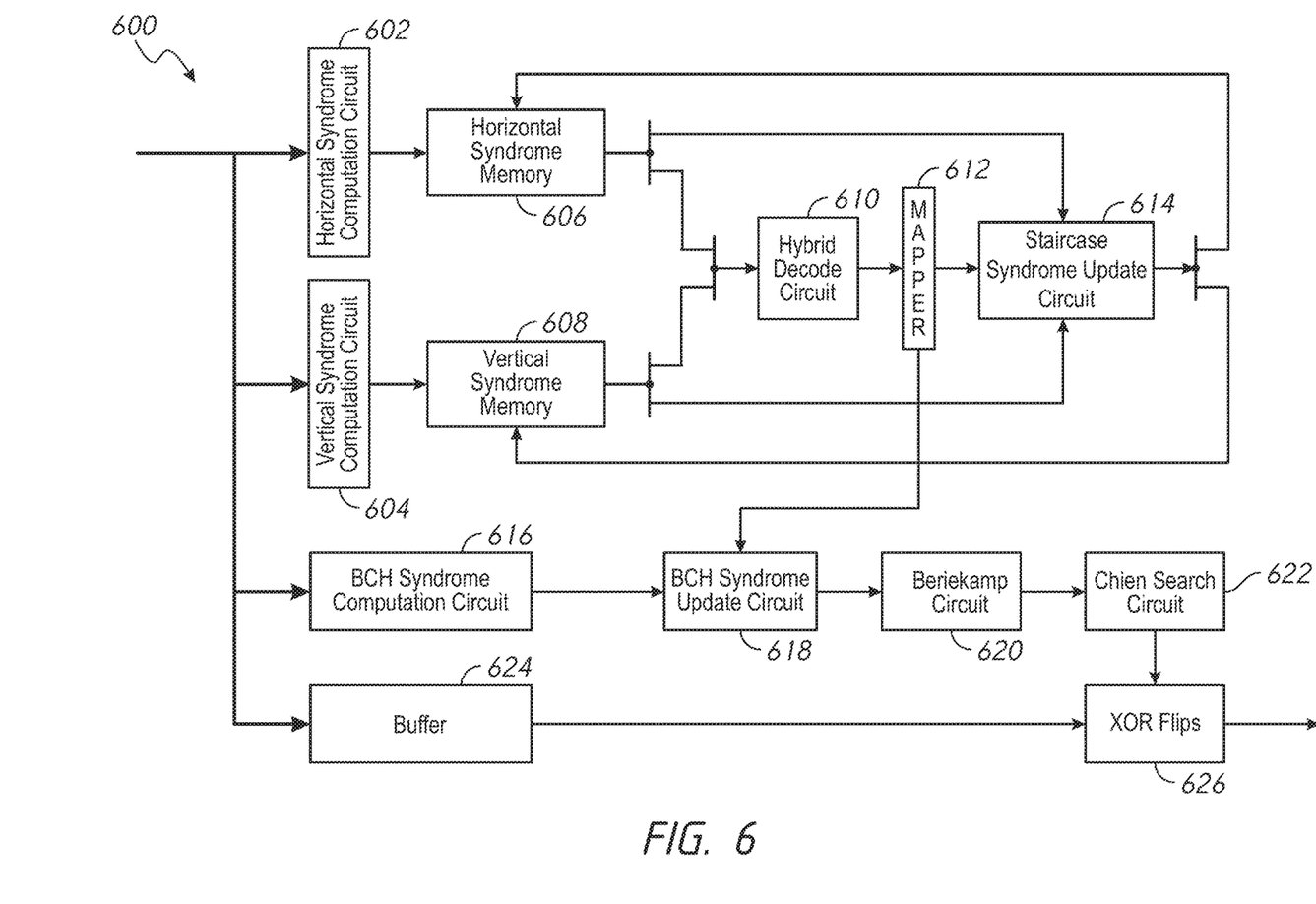
FIG. 6 is a block diagram of a decoder circuit, in accordance with an embodiment of the present invention.

FIG. 6 is a block diagram of an SCC decoder circuit, generally designated 600, in accordance with an embodiment of the present invention. The SCC decoder circuit 600 may be implemented as the SCC decoder circuit 112 of FIG. 1. Generally, the SCC decoder circuit 600 is configured to decode a staircase code having component codewords that each span multiple columns and multiple rows, as discussed above with respect to FIG. 5. The SCC decoder circuit 600 includes a horizontal syndrome computation circuit 602, a vertical syndrome computation circuit 604, a horizontal syndrome memory 606, a vertical syndrome memory 608, a hybrid decode circuit 610, a mapper circuit 612, a staircase syndrome update circuit 614, a BCH syndrome computation circuit 616, a BCH syndrome update circuit 614, a Berlekamp circuit 620, a Chien search circuit 622, a buffer 624, and XOR flips 626.

The horizontal syndrome computation circuit 602 may be configured to calculate a complete or partial syndrome of a horizontal component codeword in a staircase code. As will be appreciated by those skilled in the art, syndrome decoding is a highly efficient method of decoding a linear code, such as a BCH code. The syndrome indicates the locations of errors in the component codeword. The complete or partial syndrome of a given component codeword may be calculated based on all or some of the received data bits and parity bits in the component codeword. In various embodiments, component codeword bits may be serially received by the SCC decoder circuit 600. In one embodiment, the received bits may be received for a horizontal component codeword such that the data bits of the component codeword are received followed by the parity bits of the component codeword. As a component codeword is received (e.g., from the memory array 108), the horizontal syndrome computation circuit 602 may calculate the syndrome for the horizontal component codeword to identify the locations of one or more errors in the received codeword. The horizontal syndrome computation circuit 602 may compute the syndrome of a horizontal component codeword as the component codeword bits are still being received, until all of the component codeword bits (data bits and parity bits) have been received for the component codeword and the syndrome calculation is completed.

The horizontal syndrome memory 606 may generally be any type of memory. The horizontal syndrome memory 606 may be configured to store complete or partial syndromes for horizontal component codewords of one or more blocks. In various embodiments, the horizontal syndrome memory 606 may be configured to store syndromes for component codewords of at least two blocks. By storing syndromes for more than one block, the horizontal syndrome memory 606 may enable the horizontal syndrome computation circuit 602 to begin syndrome computations on a subsequent block while further computations and corrections are performed on a previous block. In one embodiment, the horizontal syndrome memory 606 is configured to store all syndromes for horizontal component codewords that span two blocks. By storing all of the component codewords for a given pair of blocks, syndromes may be updated based on corrections to intersecting component codewords (i.e., vertical component codewords).

The vertical syndrome computation circuit 604 is configured to calculate a complete or partial syndrome of a vertical component codeword in the staircase code. The complete or partial vertical syndromes may be stored in the vertical syndrome memory 608. In various embodiments, the vertical syndrome computation circuit 604 may be configured to calculate partial syndromes of vertical component codewords at the same time the horizontal syndrome computation circuit 602 is calculating syndromes for horizontal component codewords.

The vertical syndrome memory 608 may generally be any type of memory. The vertical syndrome memory 608 may be configured to store complete or partial syndromes for component codewords of one or more blocks of the staircase code. In various embodiments, the vertical syndrome memory 608 may be configured to store syndromes for at least two blocks of the staircase code. By storing syndromes for component codewords of two or more blocks, the vertical syndrome memory 608 may enable the vertical syndrome computation circuit 604 to begin syndrome computations on a subsequent block while further computations and corrections are performed on a previous block.

Example operations of a horizontal syndrome computation circuit 602, the vertical syndrome computation circuit 604, the horizontal syndrome memory 606, and the vertical syndrome memory 608 will now be described in the context of the staircase code shown in FIG. 5. Data bits and/or parity bits may be serially received by the horizontal syndrome computation circuit 602 for the horizontal component codeword 502. As the bits are received, the horizontal syndrome computation circuit 602 calculates the syndrome for the horizontal component codeword 502 and stores the resulting syndrome in the horizontal syndrome memory 606. The bits of the horizontal component codeword may simultaneously be provided to the vertical syndrome computation circuit 604. As noted above, horizontal component codewords and vertical component codewords with wrapped data bits and parity bits overlap at an n×n vertex 506. Although the bits of the vertical component codeword 504 are not received all in a single stream in this example, as they are with the horizontal component codeword 502, the vertical syndrome computation circuit 604 may calculate partial syndromes for the vertical component codewords and build the vertical syndromes iteratively as the SCC decoder circuit 600 progresses through the horizontal component codewords 502 of a given block.

For example, the horizontal syndrome computation circuit 602 may receive a horizontal component codeword (e.g., 6 rows of data bits and parity bits) and begin computing the horizontal syndrome for the horizontal component codeword. Once all of the bits are received, the horizontal syndrome computation circuit 602 may have calculated the syndrome for the complete horizontal component codeword 502 and stored the result in the horizontal syndrome memory 606. Simultaneously, for each n×n vertex 506 that the horizontal component codeword 502 intersects, the vertical syndrome computation circuit 604 may calculate the partial syndrome for the vertical component codeword 504 that intersects the vertex 506. Once the horizontal syndrome computation circuit 602 completes the syndrome calculation for the first horizontal component codeword 502, the horizontal syndrome computation circuit 602 moves on to the next horizontal component codeword 502. Similarly, the vertical syndrome computation circuit 604 begins calculating the partial syndromes for the vertical component codewords 504 that overlap with the second horizontal component codeword 502. By computing the partial vertical syndromes at the same time as the horizontal syndromes, the speed and efficiency of syndrome computation may be increased. Particularly, once syndrome calculation is completed for a horizontal step (e.g., 8 horizontal component codewords, each spanning 6 rows), the vertical syndromes of the next step in the staircase code are partially computed. Then, as the horizontal syndrome computation circuit begins to calculate syndromes for the next step in the staircase code 500, the remaining partial vertical syndromes are calculated. Thus, the SSC decoder circuit 600 avoids calculating syndromes for the horizontal component codewords 502 and vertical component codewords 504 simultaneously, which enables more efficient decoding than traditional staircase code decoding methods.

The hybrid decode circuit 610 may be configured to access the horizontal and vertical syndromes stored in the horizontal syndrome memory 606 and the vertical syndrome memory 608, respectively, and to determine the locations of detected errors in the horizontal and vertical component codewords based on the respective syndromes. In various embodiments, the hybrid decode circuit 610 may determine the locations of erroneous bits independent of the particular wrapping scheme employed to generate the staircase code. For example, the hybrid decode circuit 610 may indicate the position of erroneous bits in the component codeword (e.g., the position from the beginning of the component codeword), but not necessarily the location of the erroneous bit in the staircase code (e.g., the particular row and column in the staircase code).

The mapper 612 is configured to translate the positions of the identified bit errors from the hybrid decode circuit 610 into bit locations in the particular block being decoded. As discussed above, component codewords may be wrapped across multiple rows and/or columns in the blocks of the staircase code. When the hybrid decode circuit 610 determines the positions of erroneous bits, it does so independent of the particular wrapping scheme employed in generating the staircase code. The mapper 612 references the particular mapping scheme in order to determine the actual locations of erroneous bits within the block of the staircase code that require correction (e.g., the particular row and column, as opposed to the position in the component codeword).

The staircase syndrome update circuit 614 is configured to update the calculated syndromes stored in the horizontal syndrome memory 606 and the vertical syndrome memory 608 based on the locations of erroneous bits, as determined by the hybrid decode circuit 610 and the mapper 612. As discussed above, the vertical syndrome computation circuit 604 may calculate partial vertical syndromes at the same time that the horizontal syndrome computation circuit 602 calculates syndromes for complete horizontal component codewords. However, when the hybrid decode circuit 610 determines that a bit in the horizontal component codeword (or vertical component codeword) is in need of correction, that corrected bit may affect the calculation of a partial vertical syndrome that was calculated for the portion of the vertical component codeword at a vertex 506 and/or a syndrome of a horizontal component codewords. The staircase syndrome update circuit 614 accesses the horizontal syndrome memory 606 and/or the vertical syndrome memory 608 and updates the calculated syndromes based on the identified locations of erroneous bits. Accordingly, syndromes may be updated in real time as the hybrid decode circuit 610 and the mapper 612 determine the locations of erroneous bits. The updated syndromes may be indicative of additional erroneous bits in the component codewords. Accordingly, the updated syndromes may be provided to the staircase syndrome update circuit 614, which can determine whether further updates are necessary based on the updated syndrome.

As discussed above, the staircase code may be further encoded using an optional outer BCH code (or other type of code). In such embodiments, the BCH syndrome computation circuit 616 may be configured to calculate the syndrome of the outer BCH code. In various embodiments, the BCH syndrome computation circuit 616 may be configured to compute the BCH syndrome in parallel to the horizontal syndrome computation circuit 602 and the vertical syndrome computation circuit 604 computing the syndromes of the component codewords of the staircase code. Similarly to the staircase syndrome update circuit 614, the BCH syndrome update circuit 614 may be configured to update the syndrome calculated by the BCH syndrome computation circuit 616 based on corrected bits as erroneous bits are corrected by the hybrid decode circuit 610 and the mapper 612. Accordingly, the mapper 612 may be coupled to the BCH syndrome update circuit 614 to correct the computed BCH syndromes.

The Berlekamp circuit 620 and the Chien search circuit 622 are configured to perform operations associated with the outer BCH code. For example, the Berlekamp circuit 620 may be configured to determine a polynomial for locating errors in the BCH code. In various embodiments, the Berlekamp circuit 620 implements a Berlekamp-Massey algorithm to identify an error locator polynomial based on the syndrome determined by the BCH syndrome computation circuit 616 and the BCH syndrome update circuit 614. The Chien search circuit 622 may be configured to determine the roots of the polynomial determined by the Berlekamp circuit 620. The identified roots may be used to determine which bits in the decoded data require correction.

The buffer 624 is configured to store the data bits to be provided. In various embodiments, the buffer 624 may be configured to store data bits for two or more blocks at a time. For example, the buffer 624 may be configured to store data bits for two blocks (e.g., two 4 KB codewords). The circuits and operations described above with respect to the horizontal syndrome computation circuit 602, the horizontal syndrome computation circuit 604, the BCH syndrome computation circuit 616 and the other blocks of FIG. 6 all operate in the syndrome domain. That is, when the hybrid decode circuit 610 and the mapper 612 identify locations of erroneous bits, the staircase syndrome update circuit 614 is responsible for correcting the calculated syndromes. Once the erroneous bits are identified using the syndromes of the component codewords and the outer BCH code, those identified bits may be corrected in the complete codeword (i.e., a block of the staircase code), which is then provided to the host 102 for use. In order to correct the bits in the requested codeword, the data bits may be stored in the buffer 624, and identified erroneous data bits may be corrected by XOR flips 626. In various embodiments, the codeword is a 4 KB codeword, as is commonly used in various memory devices. The XOR flips 626 may be configured to selectively alter the logic state of bits within the complete codeword based on the locations of the erroneous bits identified by the mapper 612 and the outer BCH code (as decoded by the BCH syndrome computation circuit 616, the BCH syndrome update circuit 614, the Berlekamp circuit 620, and the Chien search circuit 622. Once the identified erroneous bits have been corrected, the corrected codeword may be provided to the host 102.

Figure 7:
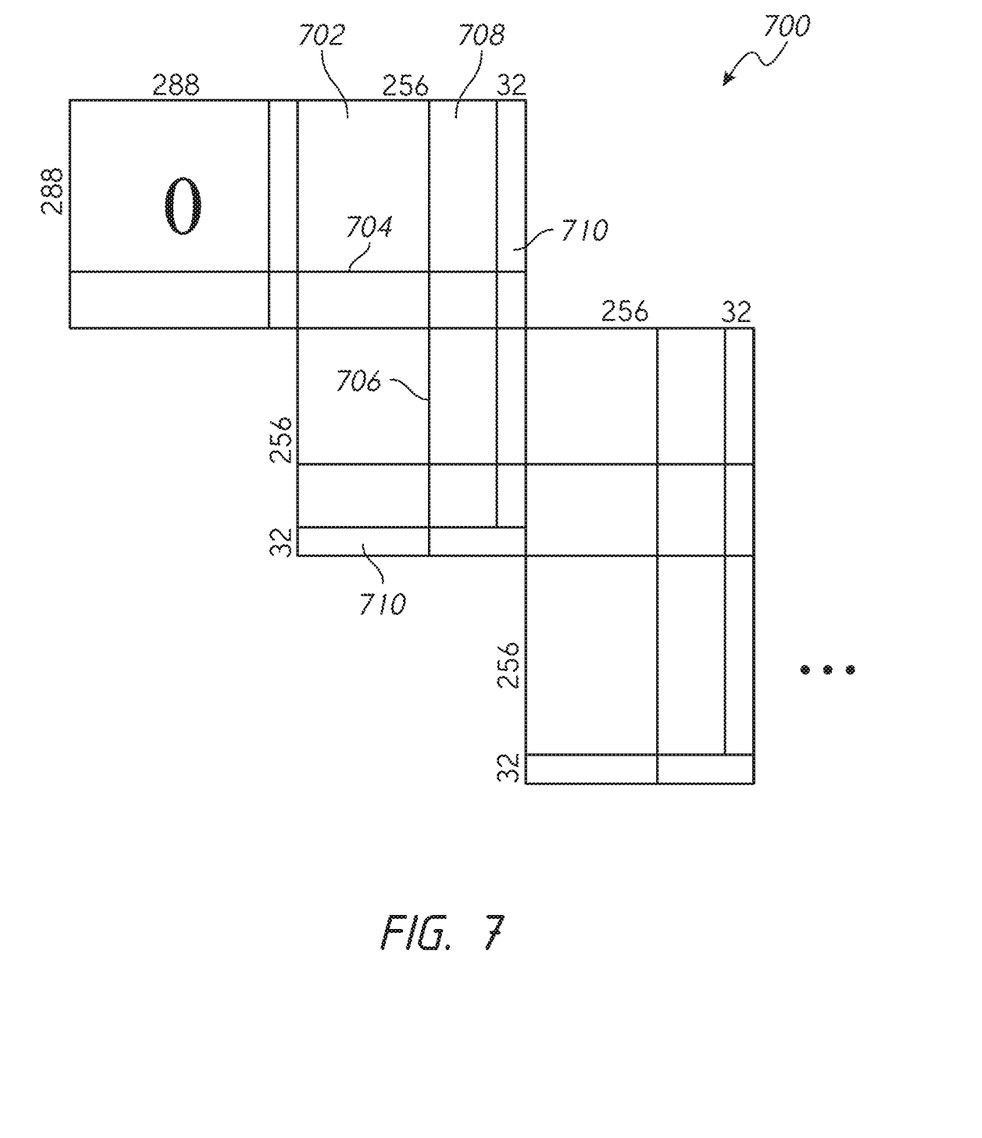
FIG. 7 is an example staircase code, in accordance with an embodiment of the present invention.
Figure 8:
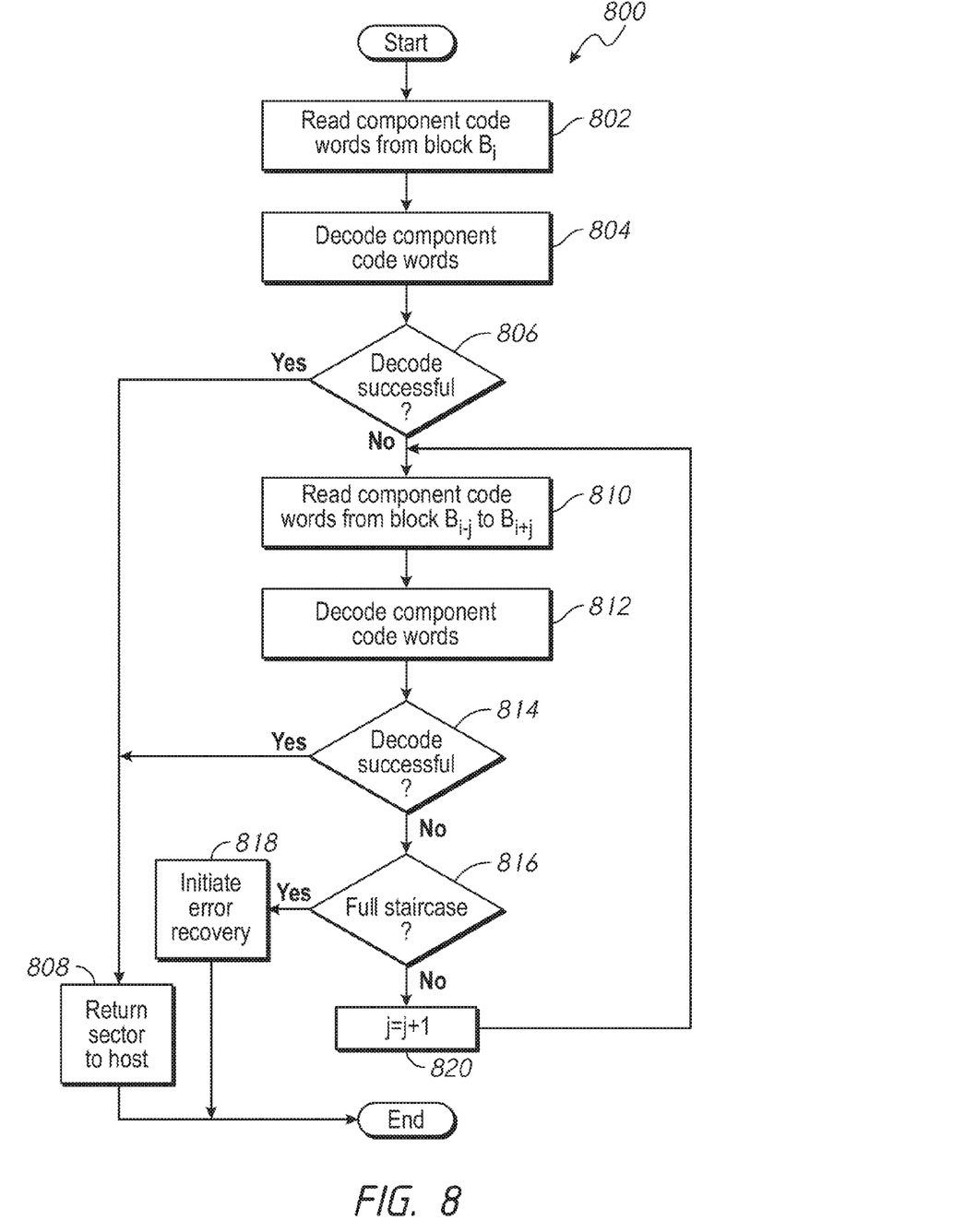
FIG. 8 is flowchart illustrating a method of decoding a staircase code, in accordance with an embodiment of the present invention.

FIG. 7 is an example staircase code, generally designated 700, in accordance with an embodiment of the present invention. In certain storage applications, staircase codes may be constructed such that the codewords are larger than the size of the requested sector. That is, in such applications, codewords may not need to be limited to approximately 4 KB. Larger codewords enable lower error floors, which may eliminate the need for the outer BCH code described above. Examples of such applications include, but are not limited to, applications that are dominated by sequential reads and writes, such as streaming, applications that are dominated by sequential writes, but not necessarily sequential reads, and cold storage applications where data are not frequently accessed and therefore are not subject to strict latency targets. FIGS. 7 and 8 describe a windowed decoding strategy enabling several tiers of hard input decoding, each with increasing correction capability.

The staircase code 700 includes a number of blocks 702 arranged in a staircase pattern. The blocks 702 include horizontal component codewords 704 and vertical component codewords 706. Each component codeword 704, 706 includes a number of data bits 708 and a number of parity bits 710. In the example embodiment of FIG. 7, each block is 288×288 bits. Each component codeword 704, 706 includes 544 data bits 708 and 32 parity bits 710. Accordingly, each component codeword 704 fits within a single row or column of the staircase code. For each step, the staircase code 700 includes 256 vertical component codewords 706 protecting data bits 708 and 32 vertical component codewords 706 protecting the horizontal parity bits 710. In an example embodiment with 12 blocks, each step (i.e., a pair of adjacent blocks in the staircase code 700) includes approximately 20 KB of data bits 708 and parity bits 710, and the entire 12 block staircase code includes approximately 124 KB of data bits. Where the requested sector of data is substantially smaller than the staircase code, it would be inefficient to decode the entire staircase code 700 to obtain the requested sector. Accordingly, embodiments disclose a windowed decoding scheme to decode the requested sector with varying correction capability.

FIG. 8 is flowchart illustrating a method of decoding a staircase code, generally designated 800, in accordance with an embodiment of the present invention. In operation 802, a control circuit, such as control circuit 106, reads the component codewords from a block $B_i$. In various embodiments, the block $B_i$ may be the center block of the staircase code. That is, there may be an equal number of blocks before and after the block $B_i$ in the staircase code. In other embodiments, the block $B_i$ may be a block other than the center block of the staircase code. In operation 804, the control circuit decodes the component codewords of the block $B_i$. Decoding block $B_i$ may generally be performed in any appropriate means. In various embodiments, the mechanism of decoding the component codewords of block $B_i$ depends on the type of encoding used to construct the component codewords of the staircase code. For example, the component codewords may be encoded using a BCH code, in which case, BCH decoding is used to decode the component codewords.

In decision block 806, the control circuit determines whether the decode operation of operation 804 was successful. In various embodiments, the number of errors that occur in the component codewords may be completely corrected based on the encoding mechanism used to construct the component codewords. For example, if each component codeword has a correction capacity of t=3, then up to 3 data bits of each component codeword may be corrected using the parity bits of the component codeword. Alternatively, there may be more errors in the component codeword than are correctable using the just the parity bits of the component codeword. For example, if the component codeword has a correction capacity of t=3, but the component codeword includes four erroneous bits, then the component codeword cannot be corrected using only the parity bits of the component codeword. If the decode is successful (decision block 806, YES branch), then the block is returned to the host (i.e., the processor requesting the block) in operation 808. The control circuit may provide the block to the host via one or more data buses. If the control circuit determines that the decode was not successful (decision block 806, NO branch), then the control circuit reads component codewords from blocks $B_{i-j}$ and $B_{i+j}$ in operation 810. The control circuit may retrieve the blocks from either side of the block $B_i$. Because each bit in a staircase code is protected by two component codewords (i.e., a horizontal component codeword and a vertical component codeword), expanding the decoding operation to blocks on either side of the block $B_i$ may enable additional bits to be decoded in a codeword.

In operation 812, the control circuit performs decoding on the retrieved additional blocks and the block $B_i$. The additional blocks may be less than the complete staircase code. For example, a block $B_i$ may be decoded based on one additional block on either side of the block $B_i$, or two additional blocks, etc. Decoding may be performed in a similar manner to the initial decoding, based on the encoding mechanism used to encode the data. By decoding additional blocks on either side of the initial block, component codewords in the block $B_i$ that include uncorrectable errors based on just the parity bits of that codeword can be corrected by determining the values of the bits using overlapping component codewords of surrounding blocks. For example, with reference to FIG. 7, if a horizontal component codeword 704 includes more erroneous bits than can be corrected using the parity bits 710 associated with that component codeword, then decoding of vertical component codewords 706 can be employed to decode the bits of the horizontal component codeword 704.

In decision block 814, the control circuit determines whether the block $B_i$ was successfully decoded in operation 812. If the block $B_i$ was successfully decoded (decision block 814, YES branch), then the control circuit returns the requested sector to the host in operation 808. If the control circuit 814 determines that the block $B_i$ was not successfully decoded (decision block 814, NO branch), then the control circuit determines whether the entire staircase code has been decoded in decision block 816. If the entire staircase code has been decoded (decision block $B_i$, YES branch), then the control circuit initiates error recovery in operation 818 and execution of the method 800 terminates. If the control circuit determines that the entire staircase code has not been decoded (decision block 816, NO branch), then the control circuit increments the number of blocks to be included in the range of blocks to be decoded, and proceeds to read component code words for the blocks in the new, larger window in operation 810. The method 800 may iterate until the requested sector is successfully decoded or until the complete staircase code is decoded and error recovery is initiated. Iteratively decoding increasing numbers of blocks enables requested sectors to be provided to the host while minimizing the decoding time by limiting the decoding operations to only those blocks necessary to decode the requested sector. Therefore, the decoding operation avoids expending unnecessary resources decoding the complete staircase code when decoding only a portion of the staircase code is necessary to satisfy the host's request.

Figure 9:
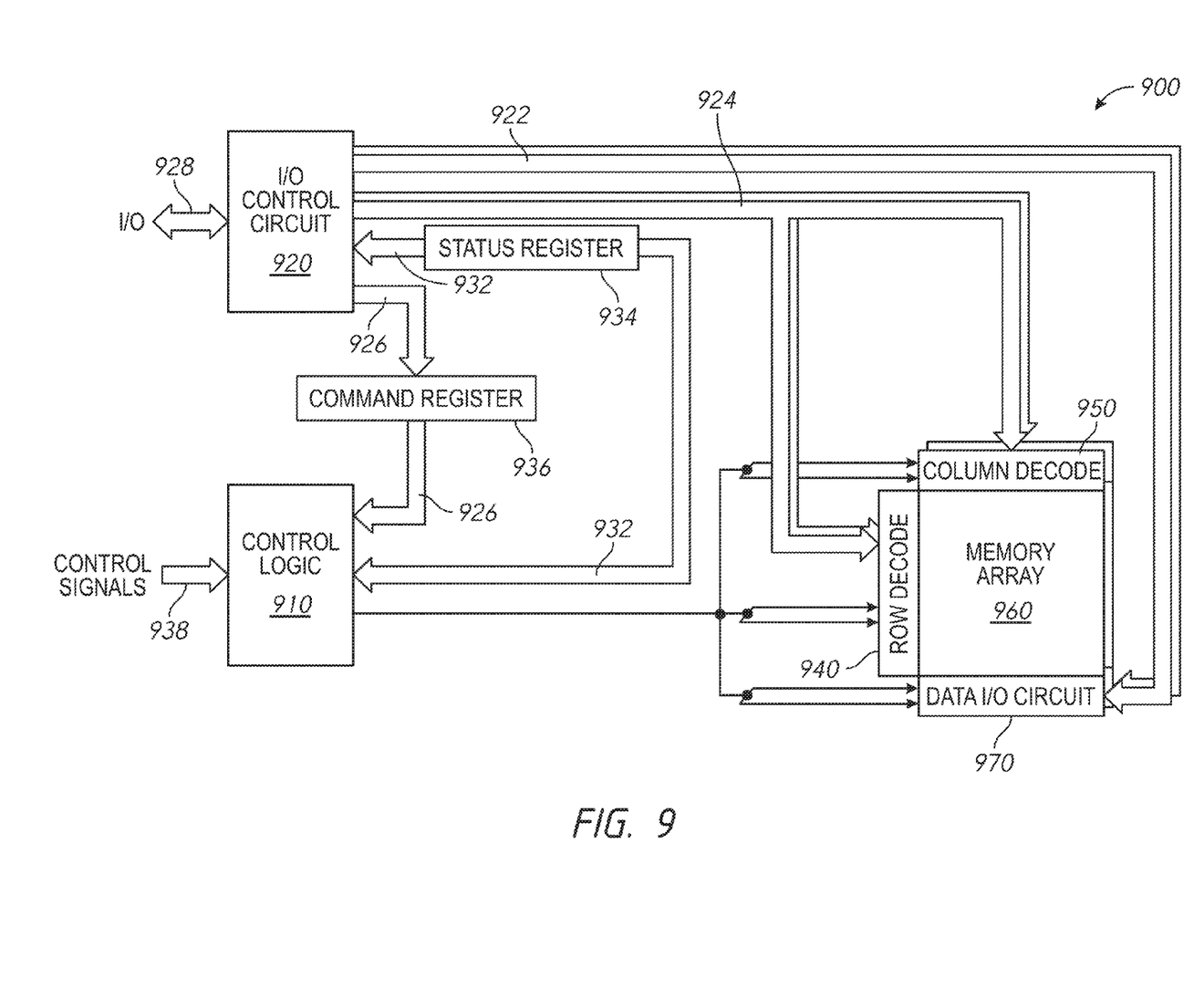
FIG. 9 is a block diagram of a memory, in accordance with an embodiment of the present invention.

FIG. 9 illustrates an apparatus that includes a memory device 900 according to an embodiment of the present invention. The memory device 900 includes a memory array 960 with a plurality of memory cells that are configured to store data. The memory cells may be accessed in the array through the use of various signal lines, word lines (WLs), and/or bit lines (BLs). The memory cells may be non-volatile memory cells, such as NAND or NOR flash cells, phase change memory cells, or may generally be any type of memory cells. The memory cells of the memory array 960 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

A data strobe signal DOS may be transmitted through a data strobe bus (not shown). The DOS signal may be used to provide timing information for the transfer of data to the memory device 900 or from the memory device 900. The I/O bus 928 is connected to an I/O control circuit 920 that routes data signals, address information signals, and other signals between the I/O bus 928 and an internal data bus 922, an internal address bus 924, and/or an internal command bus 926. The I/O control circuit 920 is coupled to a status register 934 through a status register bus 932. Status bits stored by the status register 934 may be provided by the I/O control circuit 920 responsive to a read status command provided to the memory device 100. The status bits may have respective values to indicate a status condition of various aspects of the memory and its operation. The I/O control circuit 920 may also be configured to perform encoding and decoding operations on data to be stored in or retrieved from the memory array 960. In various embodiments, the I/O control circuit 920 may be implemented as the control circuit 106 of FIG. 1.

The memory device 900 also includes a control logic 910 that receives a number of control signals 938 either externally or through the command bus 926 to control the operation of the memory device 900. The control signals 938 may be implemented with any appropriate interface protocol. For example, the control signals 938 may be pin based, as is common in dynamic random access memory and flash memory (e.g., NAND flash), or op-code based. Example control signals 938 include clock signals, read/write signals, clock enable signals, etc. A command register 936 is coupled to the internal command bus 926 to store information received by the I/O control circuit 920 and provide the information to the control logic 910. The control logic 910 may further access a status register 934 through the status register bus 932, for example, to update the status bits as status conditions change. The control logic 910 may be configured to provide internal control signals to various circuits of the memory device 900. For example, responsive to receiving a memory access command (e.g., read, write), the control logic 910 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The row decoder 940 and column decoder 950 may be used to select blocks of memory cells for memory operations, for example, read and write operations. The row decoder 940 and/or the column decoder 950 may include one or more signal line drivers configured to provide a biasing signal to one or more of the signal lines in the memory array 960.

A data I/O circuit 970 includes one or more circuits configured to facilitate data transfer between the I/O control circuit 920 and the memory array 960 based on signals received from the control logic 910. In various embodiments, the data I/O circuit 970 may include one or more registers, buffers, and other circuits for managing data transfer between the memory array 960 and the I/O control circuit 920. For example, during a write operation, the I/O control circuit 920 receives the data to be written through the I/O bus 928 and provides the data to the data I/O circuit 970 via the internal data bus 922. The data I/O circuit 970 writes the data to the memory array 960 based on control signals provided by the control logic 910 at a location specified by the row decoder 940 and the column decoder 950. During a read operation, the data I/O circuit 970 reads data from the memory array 960 based on control signals provided by the control logic 910 at an address specified by the row decoder 940 and the column decoder 950. The data I/O circuit 970 provides the read data to the I/O control circuit 920 via the internal data bus 922. The I/O control circuit 920 then provides the read data on the I/O bus 928.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible, consistent with the principles and novel features as previously described.

What is claimed is:

1. An apparatus comprising:
   a first syndrome computation circuit communicatively coupled to a first syndrome memory, the first syndrome computation circuit configured to receive a codeword having a plurality of rows and a plurality of columns and further configured to compute a first syndrome for at least a portion of a first component codeword of the codeword, wherein the codeword is a portion of a staircase code, wherein the first syndrome is stored in the first syndrome memory;
   a second syndrome computation circuit communicatively coupled to a second syndrome memory, the second syndrome computation circuit configured to receive the codeword and to compute a second syndrome for at least a portion of a second component codeword of the codeword, wherein in response to completion of computing the first syndrome for a horizontal step of the staircase code, the second syndrome of a subsequent step in the staircase code is partially computed, wherein the second syndrome is stored in the second syndrome memory; and
   a hybrid decode circuit coupled to both the first syndrome memory and the second syndrome memory to access the first and second syndromes, respectively, the hybrid decode circuit configured to determine a location of one or more erroneous bits in the first or second component codewords based on the first and second syndromes, respectively.

2. The apparatus of claim 1,
   wherein the first and second component codewords span two or more rows and two or more columns of the codeword.

3. The apparatus of claim 2, further comprising:
   a mapper circuit configured to translate the location of the one or more erroneous bits in the first or second component codewords to a location of the one or more erroneous bits in the codeword.

4. The apparatus of claim 3 further comprising:
   a syndrome update circuit configured to update at least one of the first and second syndromes based on the location of the one or more erroneous bits in the codeword.

5. The apparatus of claim 1, wherein the first syndrome comprises a horizontal syndrome and the second syndrome comprises a vertical syndrome.

6. The apparatus of claim 5, wherein the staircase code is encoded by an outer code.

7. The apparatus of claim 6, further comprising a third syndrome computation circuit configured to compute a syndrome of the codeword based on the outer code.

8. A method comprising:
   generating, by a staircase code encoder circuit, a staircase code, comprising:
      a plurality of horizontal component codewords spanning a plurality of rows of a block of the staircase code; and
      a plurality of vertical component codewords spanning a plurality of columns of the block of the staircase code,
      wherein a horizontal component codeword of the plurality of horizontal component codewords and a vertical component codeword of the plurality of vertical component codewords encode a plurality of data bits;
   storing the staircase code in a memory array; and
   decoding, by a staircase code decoder circuit, the block to retrieve the plurality of data bits, wherein in response to completion of computing a horizontal syndrome for a horizontal step in the block of the staircase code, partially computing vertical syndromes of a subsequent step in the block of the staircase code, wherein decoding the block includes:
   computing, via a horizontal syndrome computation circuit communicatively coupled to a horizontal syndrome memory, the horizontal syndrome for at least a portion of the horizontal component codeword, wherein the horizontal syndrome is stored in the horizontal syndrome memory,
   computing, via a vertical syndrome computation circuit communicatively coupled to a vertical syndrome memory, the vertical syndrome for at least a portion of the vertical component codeword, wherein the vertical syndrome is stored in the vertical syndrome memory, and
   a hybrid decode circuit coupled to both the horizontal syndrome memory and the vertical syndrome memory to access the horizontal and vertical syndromes, respectively, the hybrid decode circuit configured to determine a location of one or more erroneous bits in the horizontal or vertical component codewords based on the horizontal and vertical syndromes, respectively.

9. The method of claim 8, wherein decoding the block comprises:
identifying a location of one or more erroneous bits in the horizontal or vertical component codewords.

10. The method of claim 9, further comprising:
correcting the erroneous data bit.

11. The method of claim 9, further comprising:
updating the syndrome and the partial syndrome based, at least in part, on the identified erroneous data bit.

12. The method of claim 9, wherein identifying the erroneous bit comprises:
determining a location of the erroneous data bit in the block via a mapper circuit communicatively coupled to the hybrid decode circuit, the mapper circuit configured to translate the location of the one or more erroneous bits in the horizontal or vertical component codewords to a location of the one or more erroneous bits.

13. A method comprising:
receiving a block of a staircase code;
decoding the block, wherein in response to completion of computing a horizontal syndrome for a horizontal step in the block of the staircase code, partially computing vertical syndromes of a subsequent step in the block of the staircase code, wherein decoding the block includes:
computing, via a horizontal syndrome computation circuit communicatively coupled to a horizontal syndrome memory, the horizontal syndrome for the horizontal step in the block of the staircase code, wherein the horizontal syndrome is stored in the horizontal syndrome memory,
computing, via a vertical syndrome computation circuit communicatively coupled to a vertical syndrome memory, the vertical syndrome for the subsequent step in the block of the staircase code, wherein the vertical syndrome is stored in the vertical syndrome memory, and
a hybrid decode circuit coupled to both the horizontal syndrome memory and the vertical syndrome memory to access the horizontal and vertical syndromes, respectively, the hybrid decode circuit configured to determine a location of one or more erroneous bits in the block of the staircase code based on the horizontal and vertical syndromes, respectively;
determining whether the block was successfully decoded;
responsive to determining that the block was not successfully decoded, iteratively receiving additional blocks of the staircase code, decoding the block based on the additional blocks, and determining whether the block was successfully decoded; and
responsive to determining that the block was successfully decoded, providing the block.

14. The method of claim 13, wherein the block of the staircase code comprises a plurality of vertical component codewords and a plurality of horizontal component codewords.

15. The method of claim 14, wherein the block comprises a plurality of bits and each bit of the plurality of bits is encoded by at least one vertical component codeword and at least one horizontal component codeword.

16. The method of claim 15, wherein the plurality of vertical component codewords and the plurality of horizontal component codewords comprise BCH codes.

17. The method of claim 13, wherein for each iteration, two additional blocks are received.

18. The method of claim 13, wherein determining whether the block was successfully decoded comprises:
determining whether all of the blocks in the staircase code have been decoded without successfully decoding the block; and
responsive to determining that all of the blocks have been decoded without successfully decoding the block, initiating an error recovery operation.

19. The method of claim 18, wherein the block is at a center of the staircase code.

20. A method comprising:
encoding a set of data in a staircase code having a plurality of vertical component codewords and a plurality of horizontal component codewords, wherein each of the vertical component codewords spans two or more rows of the staircase code and each of the horizontal component codewords spans two or more columns of the staircase code; and
retrieving the set of data in the staircase code by decoding the plurality of vertical component codewords and the plurality of horizontal component codewords, wherein in response to computing a complete horizontal syndrome for a horizontal step in the staircase code, partially computing vertical syndromes of a subsequent step in the staircase code, wherein decoding the plurality of vertical component codewords and the plurality of horizontal component codewords includes:
computing, via a horizontal syndrome computation circuit communicatively coupled to a horizontal syndrome memory, the horizontal syndrome for at least a portion of the horizontal component codeword, wherein the horizontal syndrome is stored in the horizontal syndrome memory,
computing, via a vertical syndrome computation circuit communicatively coupled to a vertical syndrome memory, the vertical syndrome for at least a portion of the vertical component codeword, wherein the vertical syndrome is stored in the vertical syndrome memory, and
a hybrid decode circuit coupled to both the horizontal syndrome memory and the vertical syndrome memory to access the horizontal and vertical syndromes, respectively, the hybrid decode circuit configured to determine a location of one or more erroneous bits in the horizontal or vertical component codewords based on the horizontal and vertical syndromes, respectively.

21. The method of claim 20, wherein the horizontal component codeword of the plurality of horizontal component codewords overlaps the vertical component codeword of the plurality of vertical component codewords at a vertex.

22. The method of claim 21, wherein the vertex comprises an array of the data in the set of data.

23. The method of claim 21, wherein partially computing vertical syndromes includes computing partial syndromes for overlapping vertical component codewords of the plurality of vertical component codewords.

24. The method of claim 20, wherein the set of data comprises a BCH codeword.

* * * * *